United States Patent
Hess et al.

(10) Patent No.: US 7,995,199 B2
(45) Date of Patent: Aug. 9, 2011

(54) METHOD FOR DETECTION OF OVERSIZED SUB-RESOLUTION ASSIST FEATURES

(75) Inventors: Carl E. Hess, Los Altos, CA (US); Yalin Xiong, Union City, CA (US)

(73) Assignee: KLA-Tencor Corporation, San Jose, CA (US)

( * ) Notice: Subject to any disclaimer, the term of this patent is extended or adjusted under 35 U.S.C. 154(b) by 287 days.

(21) Appl. No.: 12/427,459

(22) Filed: Apr. 21, 2009

(65) Prior Publication Data

US 2009/0310136 A1    Dec. 17, 2009

Related U.S. Application Data

(60) Provisional application No. 61/061,717, filed on Jun. 16, 2008.

(51) Int. Cl.
*G01N 21/00* (2006.01)
*G06K 9/00* (2006.01)

(52) U.S. Cl. ............. 356/237.5; 382/144; 356/628; 356/635; 356/636; 356/239.2; 356/239.3; 356/237.2

(58) Field of Classification Search .................. None
See application file for complete search history.

(56) References Cited

U.S. PATENT DOCUMENTS

| | | | |
|---|---|---|---|
| 5,966,677 A | 10/1999 | Fiekowsky | |
| 6,526,164 B1 | 2/2003 | Mansfield et al. | |
| 6,539,331 B1 | 3/2003 | Fiekowsky | |
| 6,757,645 B2 | 6/2004 | Chang et al. | |
| 7,233,887 B2 | 6/2007 | Smith | |
| 2005/0088640 A1 | 4/2005 | Eib et al. | |
| 2007/0292777 A1 | 12/2007 | Melvin et al. | |
| 2008/0034343 A1 | 2/2008 | O'Brien | |
| 2008/0063948 A1 | 3/2008 | O'Brien | |
| 2008/0082952 A1* | 4/2008 | O'Brien | 716/19 |
| 2009/0064085 A1* | 3/2009 | Bang | 716/21 |

FOREIGN PATENT DOCUMENTS

EP    134997 A2 *   3/1985

OTHER PUBLICATIONS

WO patent application No. PCT/US2009/047357, Written Opinion mailed Jan. 12, 2010.

* cited by examiner

*Primary Examiner* — Gregory J Toatley
*Assistant Examiner* — Juan D Valentin
(74) *Attorney, Agent, or Firm* — Weaver Austin Villeneuve & Sampson LLP

(57) ABSTRACT

Disclosed are methods and apparatus for inspecting a sub-resolution assist features (SRAF) on a reticle. A test flux measurement for a boundary area that encompasses a width and a length portion of a test SRAF is determined, and at least one reference flux measurement for one or more boundary areas of one or more reference SRAF's is determined. The test flux measurement is compared with the reference flux measurements. The comparison is used to then determine whether the test SRAF is undersized or oversized. If the test SRAF is determined to be oversized, it may then be determined whether the test SRAF is defective based on the comparison using a first threshold.

20 Claims, 9 Drawing Sheets

METHOD FOR DETECTION OF OVERSIZED SUB-RESOLUTION ASSIST FEATURES

CROSS REFERENCE TO RELATED PATENT APPLICATION

This application claims priority of U.S. Provisional Patent Application No. 61/061,717 filed 16 Jun. 2008 by Carl E. Hess, which is incorporated herein by reference in its entirety for all purposes.

BACKGROUND OF THE INVENTION

This invention relates to technology for inspection reticles used in manufacturing semiconductor wafers and more particularly for inspecting sub-resolution assist features (SRAF) on a reticle.

An integrated circuit (IC) is a small electronic circuit consisting mainly of semiconductor devices that has been manufactured on the surface of a thin substrate of semiconductor material, such as silicon wafers. A typical manufacturing process involves marking different areas of the wafers to be doped or to have polysilicon, insulators or conductive metal (copper, aluminum, etc.) deposited on them. The process is generally known as photolithography. During a photolithography process, light is typically used to transfer a geometric patterns representing various features of the integrated circuit from a reticle to a light-sensitive photoresist deposited on a wafer. The subsequent chemical treatment then engraves the exposed patterns into the material underneath the photoresist. The cycle is repeated for each new layer of the IC.

A typical reticle is a quartz plate that contains 4×, 5×, 10× or other magnification patterns to be reproduced on a wafer within a field area that encompasses a single die or several dies. A reticle is also called a mask or a photomask. Allowing for reduction in size of the pattern from a reticle to a wafer eases the burden of producing an acceptable reticle. During exposure the light passes only through the portions of the reticle that do not contain any images, e.g., transparent, and exposing the photoresist on the wafer. The exposed photoresist has different chemical resistant properties than unexposed one. There are two types of the photoresist: positive and negative. More common positive photoresist becomes chemically less stable when exposed and will be etched away during the subsequent process. Negative photoresist becomes more stable and unexposed parts of the photoresists are etched away. Therefore, using negative photoresist results in features on a wafer corresponding to images on a reticle, while using positive photoresist results in features on a wafer corresponding to gaps between images on a reticle. In either case, transmitted light is further passed through a reduction lens that reduces the size of the image. The reduced image is then projected to a selected field on the wafer, where the field position is determined by a device known as a stepper. The photoresist on the wafer is exposed at this field position.

Correlation between reticle's pattern and IC's layout lead to optical inspection of reticles that has become a standard procedure in the production of IC's. During one type of conventional inspection process, an optical image of the reticle is typically compared to a baseline image. The baseline image is either generated from the circuit pattern data or from an adjacent die on the reticle itself. Either way, the optical image features are analyzed and compared with corresponding features of the baseline image. Each feature difference is then compared against a single threshold value. If an optical image feature varies from the corresponding baseline feature by more than the predetermined threshold, a defect is defined.

Although these conventional reticle inspection methods provide adequate levels of detection accuracy for some applications, such inspections have been found to be inadequate for certain reticle features, such as subresolution assist features (or SRAF's). For example, when a conventional inspection is applied to all features, including SRAF's, the inspection may detect numerous nuisance defects that would not result in a defective IC and/or fail to capture "real" defects that would result in a defective IC.

Accordingly, it would be beneficial to provide improved inspection techniques for detecting real defects, such as defective SRAF's, on a reticle while minimizing the detection of nuisance defects.

SUMMARY OF THE INVENTION

The present invention addresses this need by providing a method of inspecting a SRAF on a reticle that uses different sensitivity levels and threshold values for SRAF's boundaries than for the rest of the reticle.

In one aspect, a method of inspecting a sub-resolution assist features (SRAF) on a reticle is disclosed. The method includes determining a test flux measurement for a boundary area that encompasses a width and a length portion of a test SRAF and determining at least one reference flux measurement for one or more boundary areas of one or more reference SRAF's, and comparing the test flux measurement with the reference flux measurements. The comparison is used to then determine whether the test SRAF is undersized or oversized. If the test SRAF is determined to be oversized, it may then be determined whether the test SRAF is defective based on the comparison using a first threshold. In the same or another embodiment, if the test SRAF is determined to be undersized, it may be then determined whether the test SRAF is defective based on the comparison using a second threshold that differs from the first threshold. The absolute value of the first threshold may be less than the absolute value of the second threshold.

During the reticle inspection a decreased sensitivity may be used for the test SRAF, as compared to a sensitivity that is used for other features of the reticle that do not include SRAF's. Alternatively, the test SRAF may be excluded from the reticle inspection process. Moreover, determining a test flux measurement may be performed separately from inspecting the reticle using the decreased sensitivity. The reference flux measurement may be determined based on a design database. Moreover, the boundary area of the test SRAF and one or more reference boundaries of the reference SRAF's may be established based on a plurality of parameters from a design database. Alternatively, one or more reference SRAF's that are located on the reticle may be used. In one embodiment, at least two reference flux measurements are determined.

The length portion of the test and reference SRAF's may not include the ends of the SRAFs. In one embodiment, the length portion may be no greater than about 90% of a length of a SRAF. Moreover, the boundary may include at least two SRAFs. In such case, determining the test flux measurement for the boundary area also encompasses a width of the second SRAF and a length portion of the second SRAF. The width of the boundary area may be no greater than about 200% of a SRAF.

In another aspect, a computer readable medium containing program instructions for inspecting SRAF's on a reticle is disclosed. The computer readable medium includes computer readable code for providing a test SRAF on a reticle, computer readable code for determining a test flux measurement for a test boundary area that encompasses a width of the test SRAF and a length portion of the test SRAF and determining at least one reference flux measurement for one or more reference boundary areas of one or more reference SRAF's, wherein each reference boundary area encompasses a width of each reference SRAF and a length portion of such each reference SRAF, computer readable code for comparing the test flux measurement with the one or more reference flux measurement to determine whether the test SRAF is undersized or oversized, and computer readable code for determining, if the test SRAF is determined to be oversized, whether the oversized test SRAF is defective based on the comparison using a first threshold.

In yet another aspect, a system for inspecting SRAFs on a reticle is disclosed. The system includes at least one memory and at least one processor that are configured to provide a test SRAF on a reticle, determine a test flux measurement for a test boundary area that encompasses a width of the test SRAF and a length portion of the test SRAF and determine at least one reference flux measurement for one or more reference boundary areas of one or more reference SRAF's, wherein each reference boundary area encompasses a width of each reference SRAF and a length portion of such each reference SRAF, compare the test flux measurement with the one or more reference flux measurement to determine whether the test SRAF is undersized or oversized, and, if the test SRAF is determined to be oversized, determine whether the test SRAF is defective based on the comparison using a first threshold.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF SPECIFIC EMBODIMENTS

Figure 1:
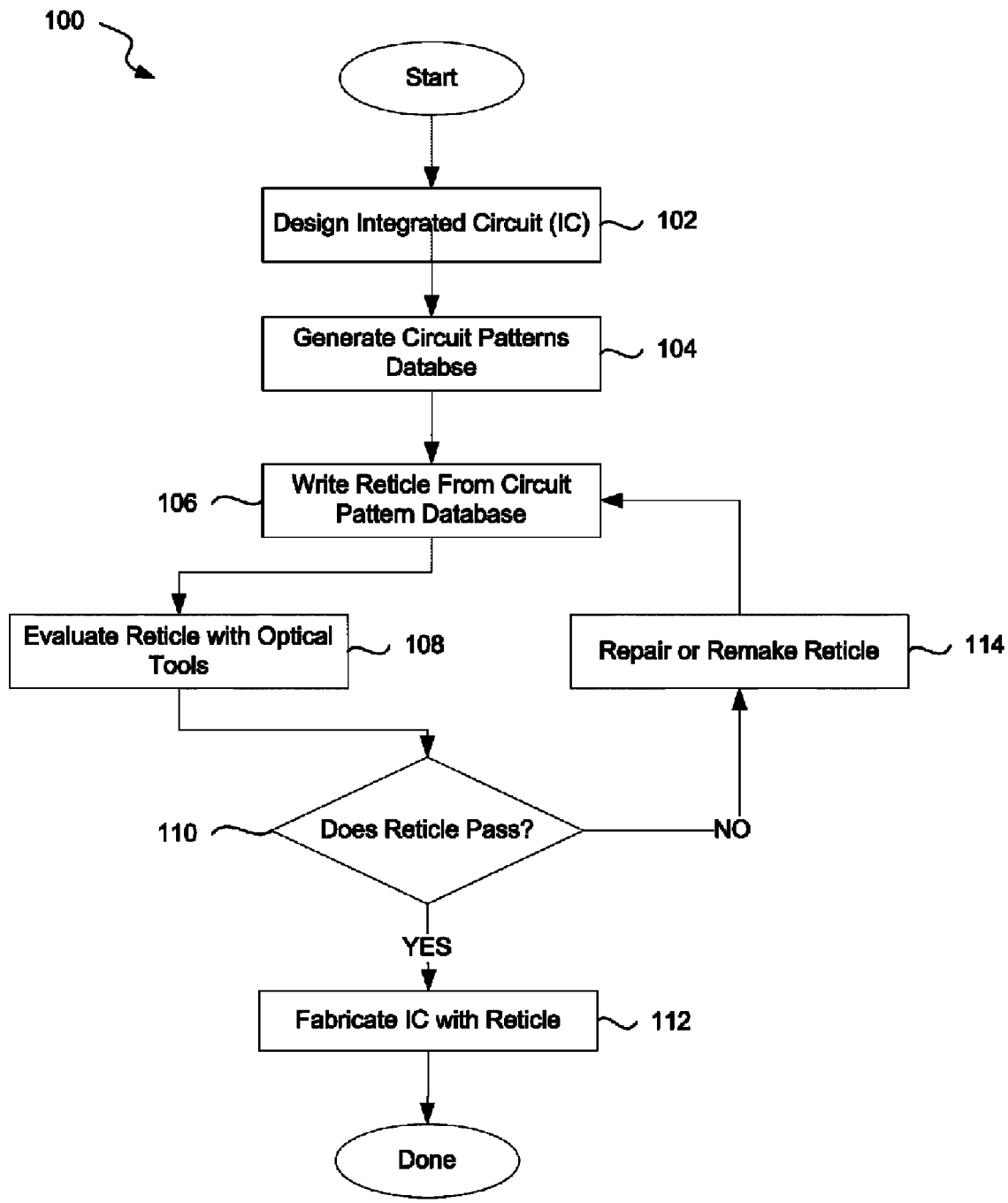
FIG. 1 is a flowchart illustrating an integrated circuit design process in accordance with one embodiment of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

An image on the reticle defines the layout of the IC. Therefore, any limitations of the reticle represent limitations of the resultant wafer circuit. For example, features on the reticle are limited to minimal line width, curvatures, spacing between two or more features, and many other parameters. Such limitations are particularly evident when a desired dimension of an IC feature is of the same order of magnitude or even smaller than the wavelength of the light source. The most common photolithography is based on ultraviolet light from gas-discharge lamps using mercury and xenon that produces light spectrum of 368-436 nm. Recent developments consider deep ultraviolet spectrum below 300 nm. At the same time the features are becoming progressively smaller targeting sizes of less 30 nm. To overcome these difficulties photolithography techniques were introduced based on light interference that cumulatively called optical proximity correction.

Some common approaches include phase-shifting, sub-resolution assist features (SRAF's), off-axis illumination, and others. Usually these approaches are used in combination. Phase shifting uses images on a reticle to block light in some areas, transmit light in other areas, and phase shift light in the areas close to the light-transmitting areas, such that the phase shifted light is 180° out of phase with respect to the transmitted light. As a result, light interference occurs in the overlap areas between the transmitted light and the phase shifted light effectively canceling the light in the overlapping area and producing a clearer edge for the resulting IC feature in a wafer. However, extensive use of phase shifting is limited in complex IC designs because of complex layout problems. For example, when laying out phase shifting mask areas on the dense patterns, phase shift conflicts may occur.

SRAF's are small features, usually in the form of parallel lines for a bright field pattern or parallel spaces for a dark field pattern. SRAF's are designed to be small enough so that they fall below the resolution limit of the imaging system but can still influence the lithographic behavior of the nearby main IC feature due to light diffraction and interference. For example, a typical SRAF may be about 100 nm wide. The width of the SRAF may vary depending on the wavelength, magnification, pattern density and other IC design and photolithography parameters. A common form of such SRAF's is a set of scattering bars. For example, a SRAF in the form of two parallel lines running along either side of the main isolated line feature, wherein SRAF lines have a width about one half the minimum design size of main features and are spaced about one minimum design size away from main features produces improved focus of the edges of the main feature. Because of their small sizes SRAF's are typically not printable on the wafer.

After reticle fabrication, each reticle is typically inspected by illuminating it with light emanating from a controlled illuminator. An optical image of the reticle is constructed based on the portion of the light reflected, transmitted, or otherwise directed to a light sensor. Such inspection techniques and apparatus are well known in the art and are embodied in various commercial products, such as many of those available from KLA-Tencor Corporation of San Jose, Calif.

During a conventional inspection process, the optical image of the reticle is typically compared to a baseline image. The baseline image is either generated from the circuit pattern design data (Die-to-Database) or from an adjacent die on the reticle itself (Die-to-Die). Either way, the optical image features of the inspected reticle are analyzed and compared with corresponding features of the baseline image so as to obtain a feature difference. Each feature difference may then be compared against a single threshold value. If the optical image feature varies from the baseline feature by more than the predetermined threshold, a defect is defined.

However, some inspection methods, such as SRAF inspection, would benefit from different sensitivities for inspection of some features of the reticle. For example, a lower sensitivity for SRAF regions would allow a reduction in the impact from nuisance and non-critical defects. Moreover, varying sensitivity can benefit SRAF inspection when SRAF's are identified as being oversized or undersized. Oversized SRAF's are more critical defects than undersized SRAF's and, accordingly, oversized SRAF's should be inspected with a higher sensitivity. On the other hand, undersized SRAF's can be inspected at reduced levels of sensitivity. Similarly, the threshold values for SRAF's inspection may vary from inspection of other features of the reticle, as well as using different thresholds for oversized and undersized SRAF's.

A general design and inspection process will first be described before more specific embodiments for inspecting SRAF's are described further below. FIG. 1 is a flowchart illustrating an integrated circuit design process 100 in accordance with one embodiment of the present invention. Initially, in operation 102, an integrated circuit (IC) device is designed using any suitable design technique. For example, an IC designer may use preexisting schematic library blocks to form the IC device using, for example, electronic design automation (EDA) tools. In some cases, the IC designer may create the IC device or part of the IC device from scratch with the aid of any suitable design system, such as conventional computer aided design (CAD) tools. For example, the IC designer may use a schematic CAD tool to plan the logic diagrams for a particular IC device. Still further, the IC designer may write a description of the IC device or portions of the IC device with the aid of a hardware design language (HDL), such as the VHSIC (Very High Speed Integrated Circuits) HDL or VHDL.

Next, in operation 104 the IC designer generates a circuit pattern database (commonly referred to as a "layout") from the IC design in operation 102. The circuit pattern database may be composed of a plurality of electronic representations of layout patterns for IC layers and corresponding Sub-Resolution Assist Features (SRAF). These layout patterns are later converted into a plurality of reticles that are used to fabricate a plurality of physical layers of an IC device on wafers. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes (herein, referred to as "figures") and corresponding SRAF's, which together define the reticle pattern. The SRAF's are designed in such a way that the SRAF pattern created on the reticle is actually not printed later on wafers. SRAF lines on a reticle should be sufficiently thin. At the same time, SRAF lines should be sufficiently thick and positioned at specific distances from the reticle representations of the main IC features in order to create light scattering and interference in such way as to sharpen edges of the main IC features on the wafer.

The circuit pattern database may be generated using any suitable technique, for example, by using EDA or CAD tools. For example, the IC designer may manually lay out the circuit patterns for the IC device with or without preexisting library cells. Alternatively, a synthesis tool may automatically create circuit patterns for the IC device from scratch or by piecing together preexisting library cells. An Optical Proximity Correction (OPC) tool may be used to generate and insert SRAFs into the circuit pattern database. For example, OPC tools manufactured by Synopsys, Inc. of Mountain View, Calif., Mentor Graphics of Wilsonville, Oreg., or any other EDA company may be used for this purpose. In one embodiment, the information about the SRAFs is stored in a separate design control layer. The information in this layer may be specific to the SRAFs and other OPC features and not include the information about the primary features. For example, the SRAF information may be a separate layer in the Graphic Data System (GDSII) database.

After the circuit pattern database is generated, the circuit pattern database is used to produce a plurality of reticles in operation 106. The reticles may be produced by any suitable pattern generator or reticle writer equipment, such as a MEBES 4500, commercially available from ETEC of Hayward, Calif.

Each reticle corresponds to one or more electronic representation(s) from the circuit pattern database. A reticle is then inspected in operation 108, and it is determined whether the reticle passes inspection in operation 110. If the reticle passes inspection, the reticle may then be used to fabricate a physical layer of the IC device in operation 112. However, if the reticle does not pass inspection, the reticle is either repaired or remade in operation 114, and the new reticle is inspected in operation 108. Operations 106 through 112 may be implemented for each electronic representation of the circuit pattern database.

The present invention may be implemented on any suitable inspection tools. For example, a KLA-Tencor TeraScan 587, commercially available from KLA-Tencor of San Jose, Calif., may be employed. One embodiment of an inspection system is described below in reference to FIG. 9.

The following description corresponds to a negative photolithography method where reticle images that block the light correspond to IC main features on a wafer. The present invention may similarly be practiced for positive photolithography applications. Moreover, the discussion generally ignores magnification of the stepper system. For example, the figures illustrate both reticle images and wafer images having approximately the same size. However, the invention is applicable to any magnification used in photolithographic imaging.

Figure 2A:
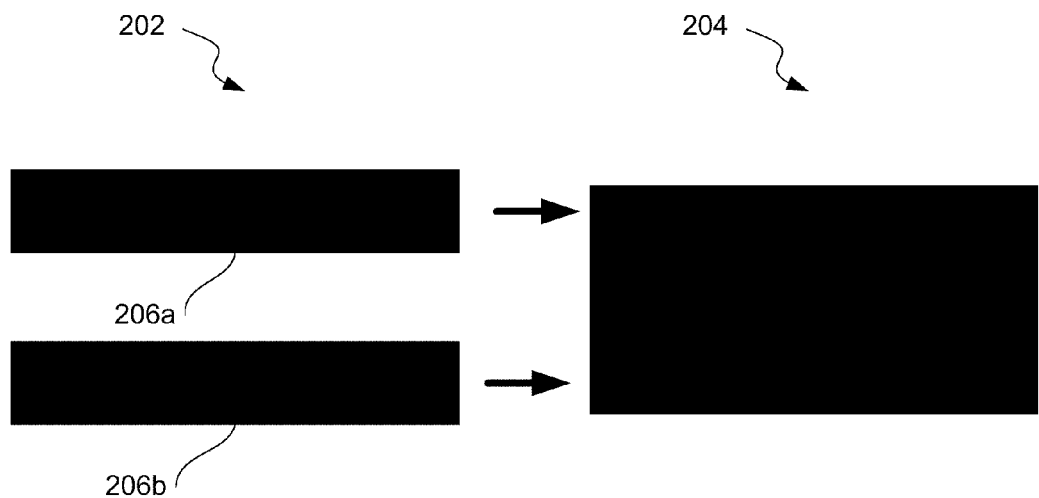
FIG. 2A is a schematic representation of typical circuit pattern features without sub-resolution assist features (SRAF's) on the reticle and a corresponding schematic representation of the image on the wafer surface.

FIG. 2A is a schematic representation 202 of two typical circuit pattern features 206a and 206b and the corresponding image (the exposure area or the printed feature) 204 on the wafer surface. The features 206a and 206b may be of any size and shape. In this example, the features 206a and 206b are two rectangular. When the features 206a and 206b are exposed on the wafer, the resulting image 204 may appear as a single block. The inconsistency between the pattern on the reticle and the image formed on the wafer is mainly due to diffraction of the light, e.g., bending of light waves during interaction with the features 206a and 206b on the reticle. The edges of the circuit pattern features 206a and 206b are blurred in the resulting image. If the circuit pattern features 206a and 206b are located close enough, then the blurring of the edges sufficiently overlap and sufficiently block the light to avoid exposure in the area between the two features. As a result the two features may be printed as one block causing a short between the two features. Diffraction effects are most pronounced for blocking features having a size comparable to wavelength.

Figure 2B:
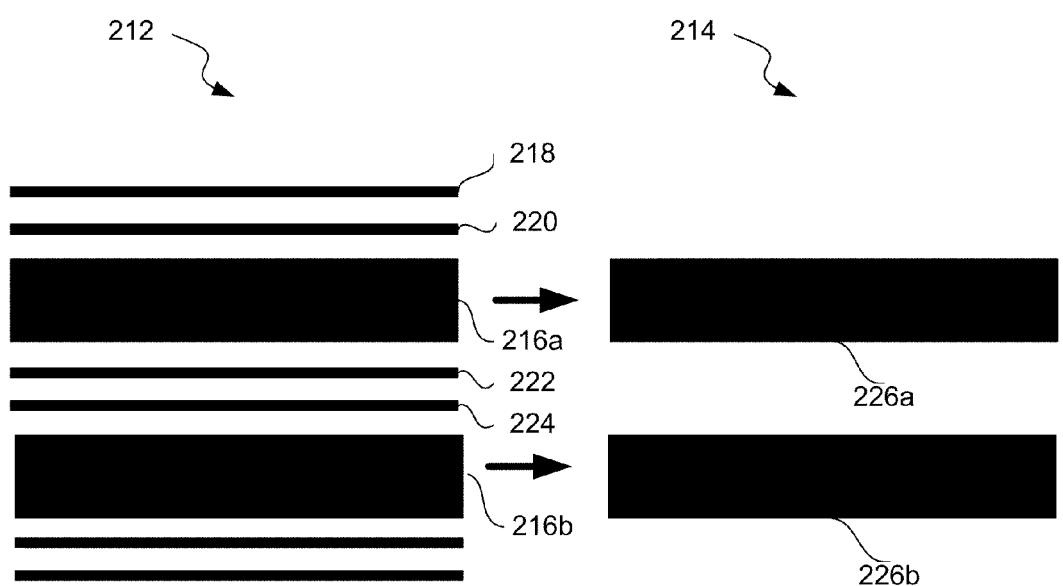
FIG. 2B is a schematic representation of typical circuit pattern features with two SRAF's along edges of the features on the reticle and a corresponding schematic representation of the image on the wafer surface.

FIG. 2B illustrates two typical circuit pattern features 216a and 216b having SRAF's 218-224 on the reticle 212 and the corresponding image (exposure area or printed feature) 214 on the wafer surface. The features 216a and 216b may be of any size and shape. In this example, the features 216a and 216b are two rectangular blocks. When the reticle is exposed, the resulting image may also include two rectangular blocks 226a and 226b of about same size. However, SRAF's 218-224 may not be printed on the wafer surface. The light diffraction and interference may help to sharpen the edges of the blocks 226a and 226b. At the same time, the light diffraction and interference may cause sufficient light exposure of the area on the wafer corresponding to the SRAFs 218-224 so that the SRAFs 218-224 are inadvertently printed on the wafer. The width of the SRAF's 218-224 and relative location to the main feature 216a and 216b are selected in such way as to provide proper interference at the wafer surface.

Figure 3A:
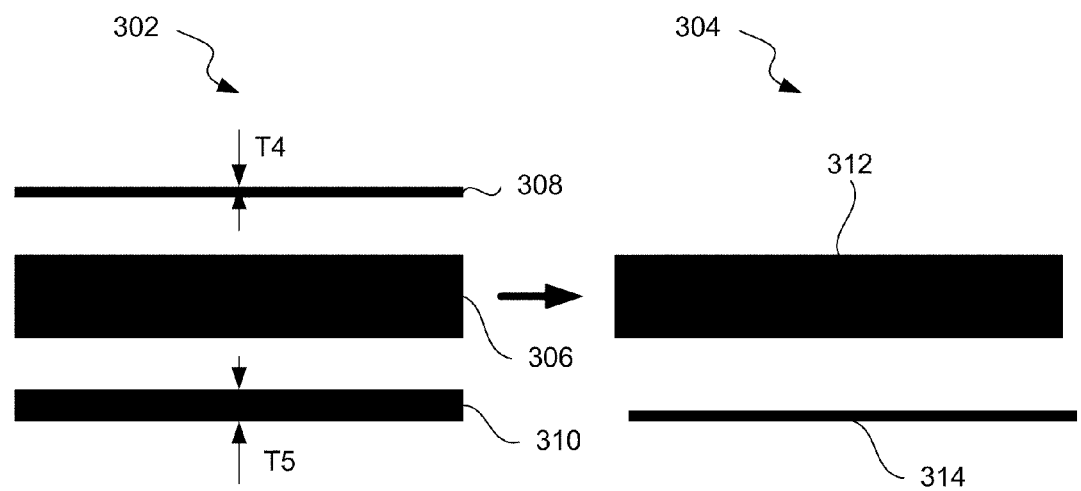
FIG. 3A illustrates a circuit pattern feature and two corresponding SRAF's of varying thickness, wherein the bottom thicker SRAF is printable on the wafer surface while the top thinner SRAF is not printable.

FIG. 3A illustrates a circuit pattern feature 306 with two SRAF's and a corresponding image 304 on the wafer surface. The narrow SRAF 308 above the feature 306 is sufficiently thin and is not printed on the wafer. The wide SRAF 310 below the feature 306 is sufficiently thick that light diffraction and interference is not enough to expose the wafer area corresponding to the SRAF 310 resulting in a printable line 314. Exposing reticle causes light diffraction at every edge of reticle element (i.e. the circuit pattern feature 306 with two SRAF's 308 and 310). The diffracted waves spread away from the edges and interfere along the way to the surface of the wafer. Some of the light transmitted directly from the light source also interferes with diffracted light. When the thin SRAF 308 is exposed, the diffracted light from SRAF edges and nearby circuit elements is sufficient to saturate the shadow area corresponding to the narrow SRAF 308. As a result, the entire area under the narrow SRAF 308 is exposed, and the narrow SRAF 308 is not printed. On the other hand, the wide SRAF 310, the diffracted light is not sufficient to expose the entire shadow area corresponding to the wide SRAF 314. Therefore, some shadow area does not receive sufficient light exposure and is printed as a thin line 314. Several problems may associate with these printed lines (i.e. printable SRAF's on the reticle). For example, these thin lines are not meant to form part of the original IC design and may cause circuit shorts and cause undesired capacitance with other IC elements. Overall, printed SRAFs may interact in many negative ways with the overall performance of the circuit.

Figure 3B:
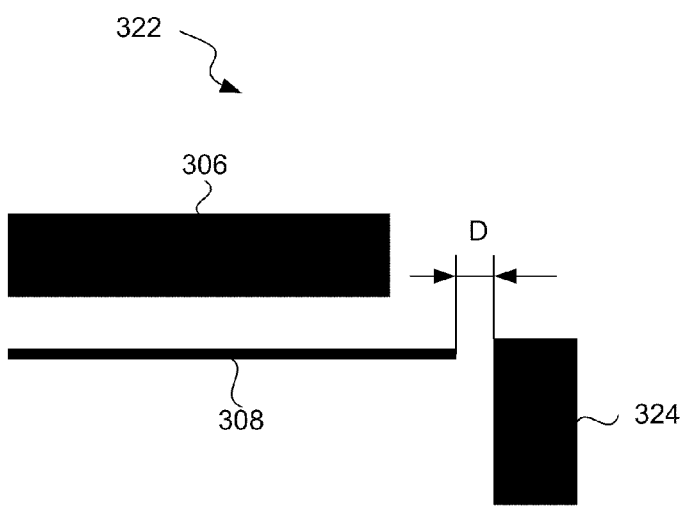
FIG. 3B illustrates a circuit pattern features and a corresponding SRAF, wherein the SRAF extends to another circuit pattern feature.

FIG. 3B illustrates a circuit pattern feature 306 and a corresponding SRAF 308, wherein the SRAF 308 extends to another circuit pattern feature 324. Light diffraction and interference occurs around the extending end of the SRAF 308 as well as the edges of the second feature 324. However, because generally SRAF's have high aspects ratio (i.e. length being much greater than width) the impact from the extending end of the SRAF 308 is minimal when compared to the long edges of the SRAF 308. Therefore, the spacing D between the end of the SRAF 308 and the feature 324 is not as critical as the thickness of the SRAF 308.

Figure 4:
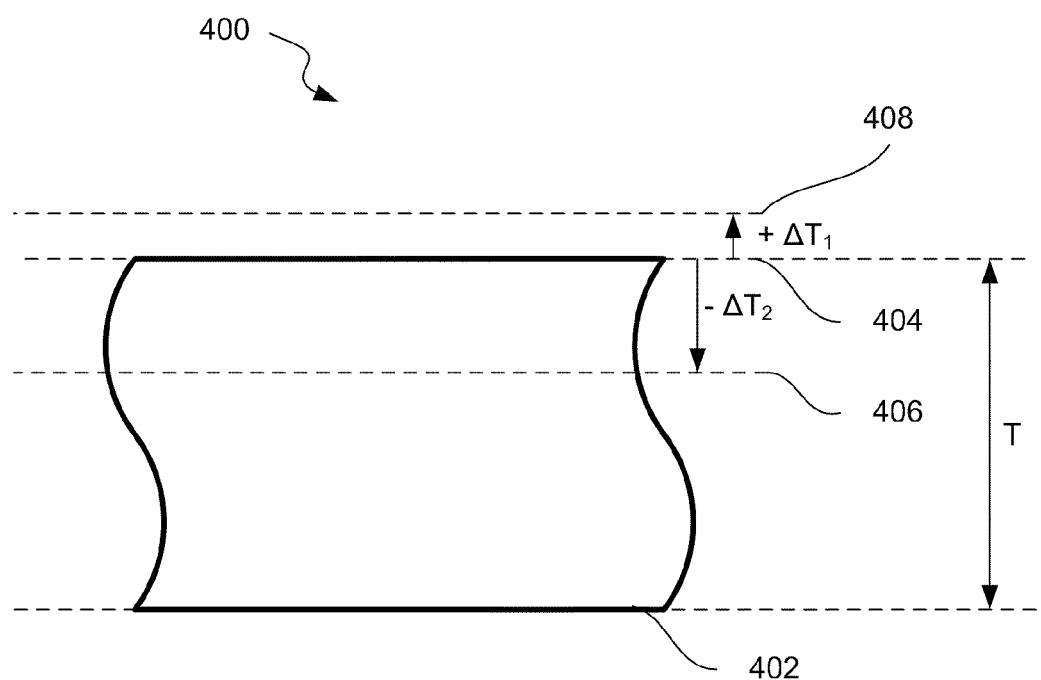
FIG. 4 is a schematic representation of an SRAF and respective thresholds for an undersized SRAF and an oversized SRAF.

FIG. 4 is a schematic representation of a SRAF 402, a first oversized threshold 408, and a second undersized threshold 406. The undersized and oversized thresholds can generally define specification limits for the difference between the design or reference SRAF thickness (i.e., T) and the fabricated or test SRAF thickness ($T+\Delta T_1$ or $T--\Delta T_2$). Any SRAF that does not fall between the two thresholds may be deemed defective, e.g., likely result in printing problems. During reticle manufacturing the design width T may drift either into oversize or undersize regions. As it was described above, SRAF's become printable on the wafer surface once reaching and exceeding certain width. Therefore, a first threshold thickness ($+\Delta T_1$) may be set for oversized SRAF's inspection. Similarly, undersized SRAF's may not provide sufficient OPC to corresponding IC elements. Thus, second threshold thickness ($-\Delta T_2$) may be set for the undersized SRAF's inspection. The impact from oversized SRAF's is more significant than for undersized SRAF's. For example, an oversized SRAF may lead to a printable line causing shorts in the circuit. On the other hand, undersized SRAF's will only impact edge sharpness of the corresponding IC features. Therefore, different deviations from the design thickness (T) 404 may be used for the first thresholds 408 ($+\Delta T_1$) and second thresholds 406 ($-\Delta T_1$). In one embodiment, the absolute value of the first threshold 408 ($|+\Delta T_1|$) may be less that the absolute value of the second threshold 406 ($|-\Delta T_2|$).

Figure 5:
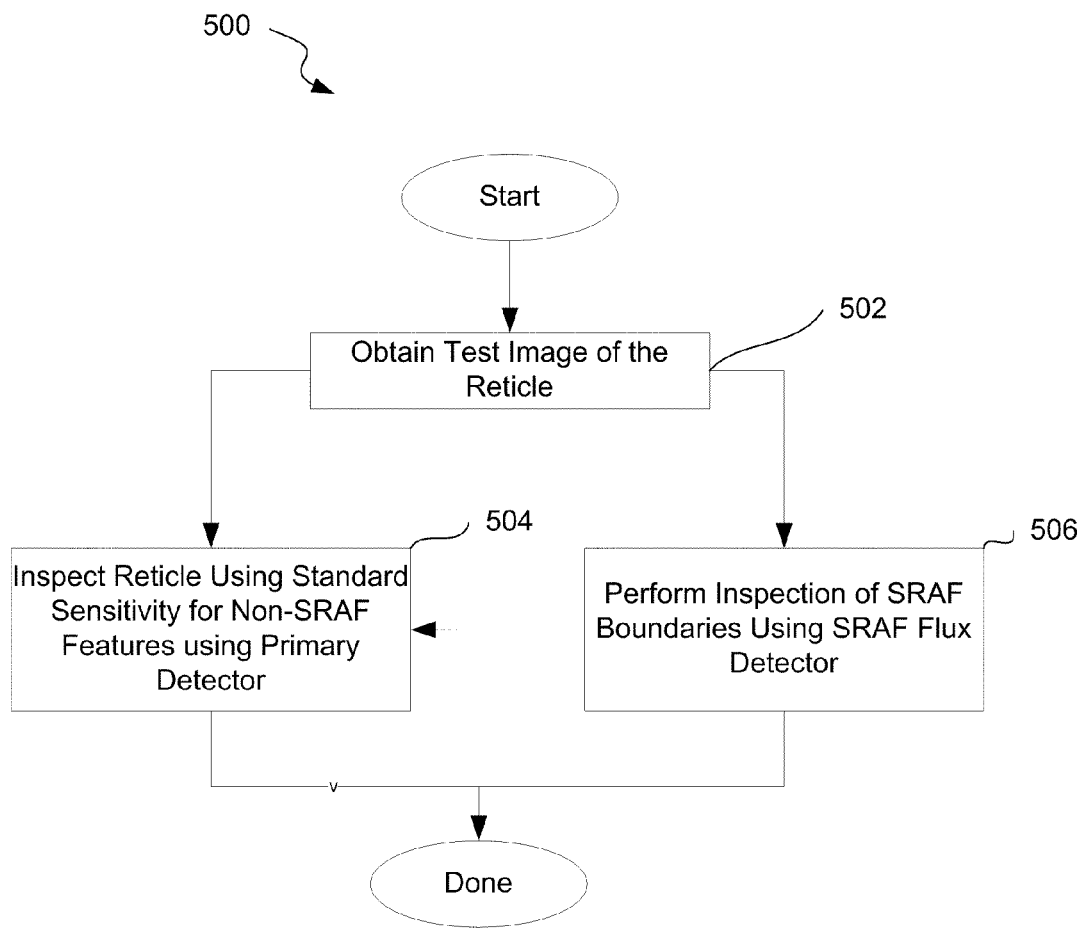
FIG. 5 is a flowchart corresponding to a method of inspecting a SRAF and inspecting a reticle according to a specific implementation of the present invention.

FIG. 5 is a flowchart corresponding to a method of inspecting SRAF's and the other non-SRAF features of the reticle according to a specific implementation of the present invention. The method may start with obtaining a test image of the reticle (block 502). Any suitable mechanisms may be implemented for obtaining the test image, such an optical or e-beam image acquisition. The image may then be inspected in two operations. The order of these operations may vary. Additionally, the term "detector" may refer to any suitable combination of processes and/or apparatus for inspecting a reticle to detect defects thereon. In one operation (block 504) a primary detector of the inspection system may be used to inspect the reticle using standard sensitivity. In the other operation (block 506) a SRAF Flux Detector may be used to inspect SRAF boundary areas. The SRAF inspection (block 506) may be performed with different sensitivity than the reticle inspection (block 504). Moreover, the SRAF Flux Detector may be adjusted to different sensitivities during the SRAF inspection depending on whether SRAF's are determined to be oversized or undersized. Varying sensitivity minimizes placing of potentially critical defects (e.g., oversized SRAF's) in the same category as nuisance or unimportant defects and reduces the number of nuisance defects. Embodiments of the SRAF inspection operation are further described below, for example, in the context of the FIG. 6.

In one embodiment, the SRAF inspection operation (block 506) may provide information about the SRAF boundary areas to the reticle inspection operation (block 504). SRAF's may be too thin for a typical inspection reticle inspection method to identify SRAF's being oversized or undersized.

For example, a typical resolution of a primary detector may lead to an SRAF image being only two pixels wide, which does not provide adequate information for SRAF inspection. Therefore, in the above embodiment the SRAF boundary areas may be desensitized during the reticle inspection. That is, the reticle inspection may ignore the SRAF boundary areas. In another embodiment, a high resolution primary detector may be used to inspect identified SRAF boundary areas. It may be performed as a part of the reticle inspection operation (block 504) or as a separate operation. For example, the main IC features on the reticle may be inspected using standard sensitivity on the primary detector, and the sensitivity may be then adjusted for the SRAF boundary areas. A separate high sensitivity detector may be used for the inspection of these areas. Alternatively, one detector adjustable to different sensitivity levels may be used.

Figure 6:
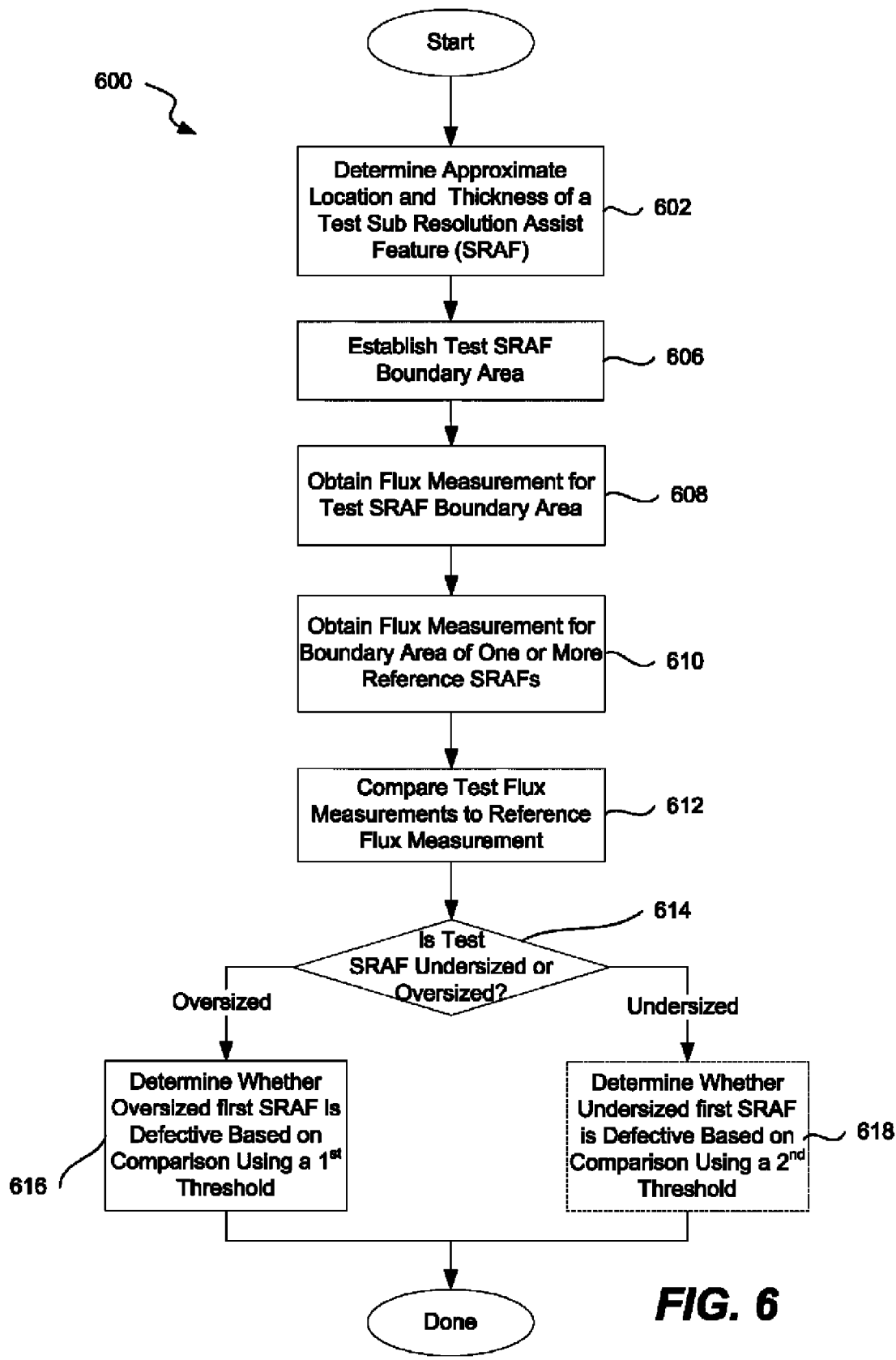
FIG. 6 is a flowchart corresponding to a SRAF inspection using a flux method in accordance to one embodiment of the present invention.

FIG. 6 is a flowchart corresponding to SRAF inspection using flux method according in accordance with one embodiment of the present invention. For example, this method may correspond to the SRAF inspection (block 506) of FIG. 5. The SRAF inspection may start with determining approximate location and thickness of a test SRAF (block 602). Of course, the location and thickness of a plurality of SRAF's on a particular reticle or reticle area may be determined during this initial operation 602. The location and thickness data may be obtained from the reticle image. For instance, a measuring operation capable of distinguishing thick lines of the main features from thin lines of the SRAF's may be used to provide the information pertaining to SRAF locations and dimensions. For example, SRAFs may be identified and located by the combination of the reflected and transmitted light properties of the pattern. The combination of those two images can also be used to measure the width of that pattern.

Figure 7:
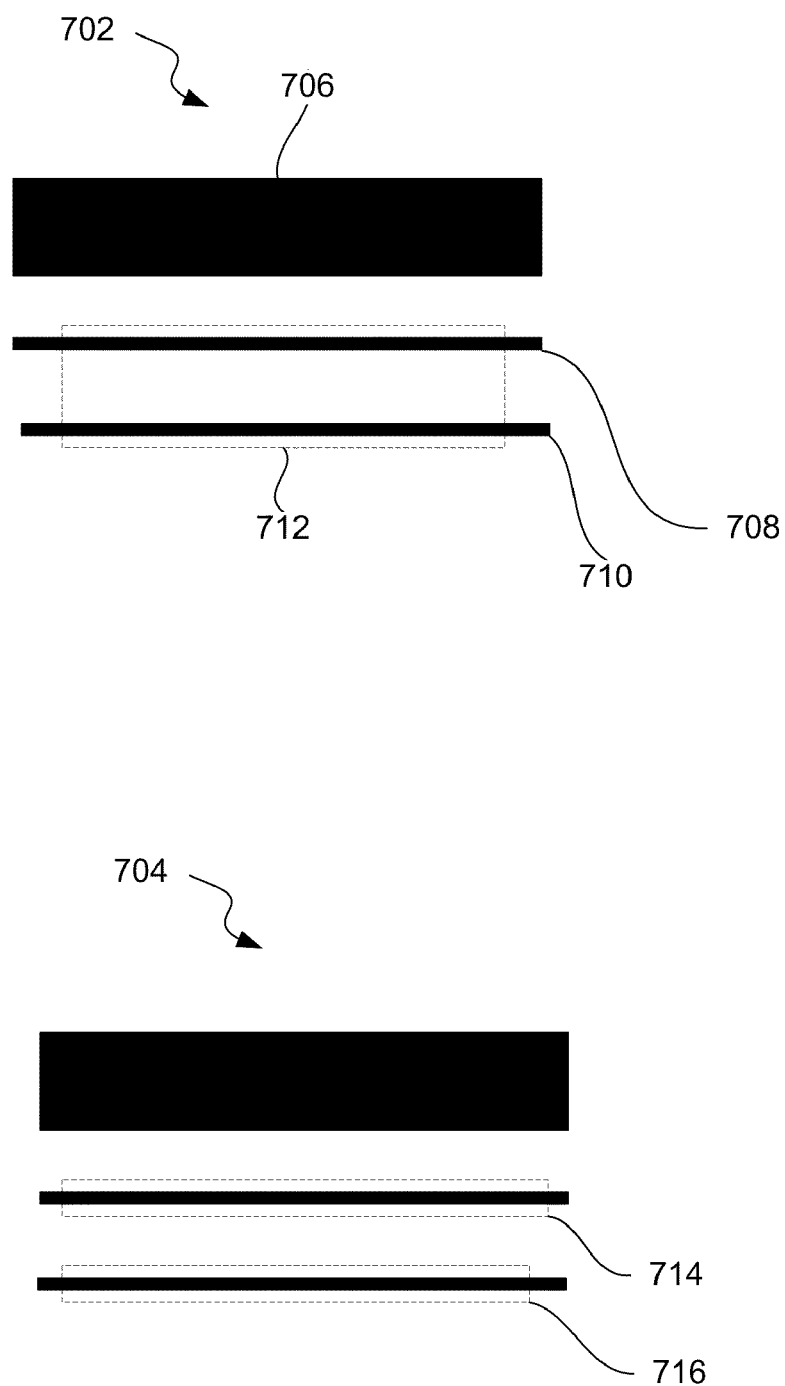
FIG. 7 is a schematic representation of establishing boundaries of multiple SRAF's that encompasses width and length portions of the SRAF's.
Figure 8:
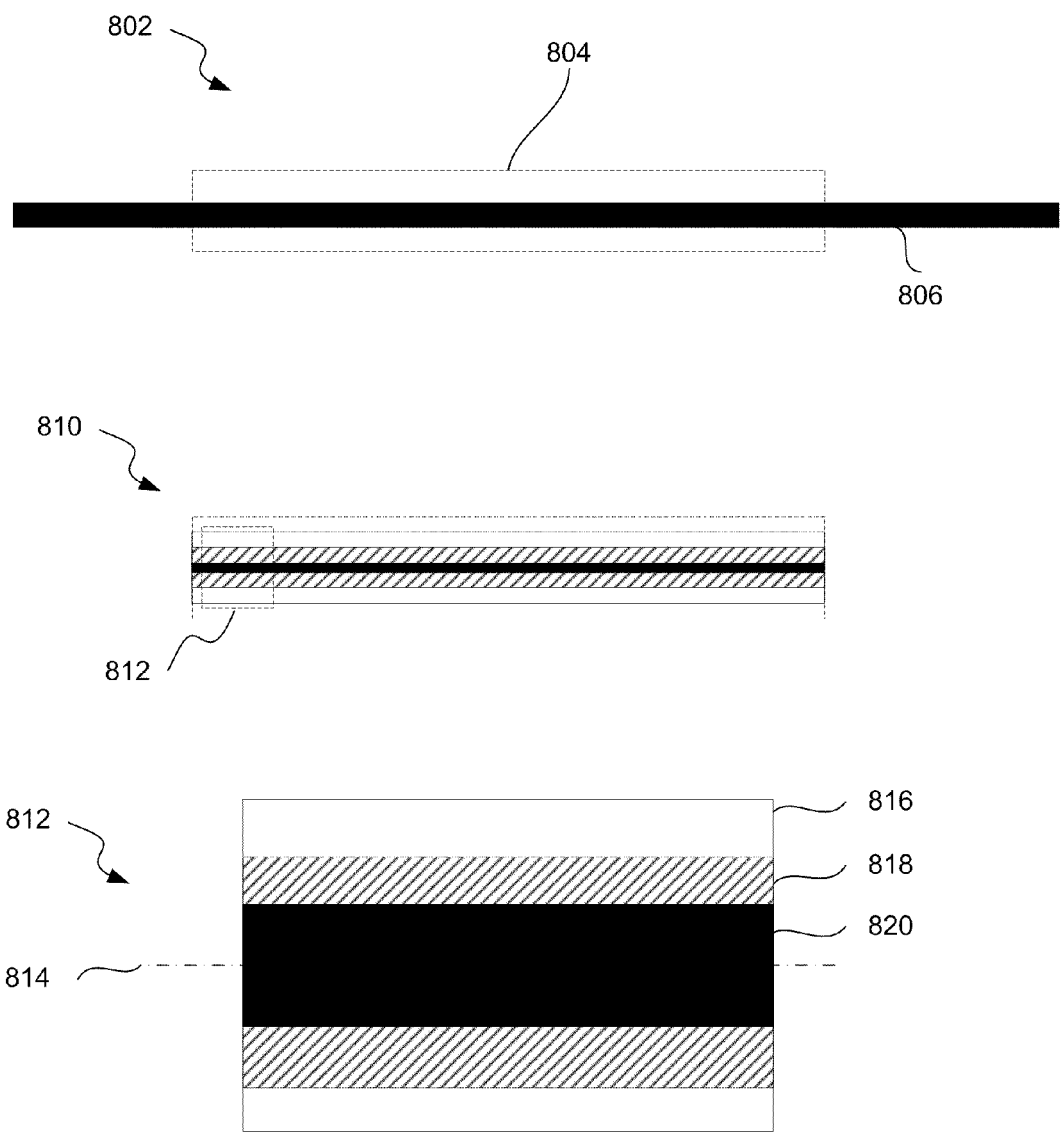
FIG. 8 is illustrates a SRAF image during the inspection and a corresponding flux measuring method.

The information containing approximate location and thickness of SRAF features may then be used to establish test boundary areas (block 606) for each test SRAF to be inspected. The boundary areas may be defined to accurately overlay corresponding test SRAF's or SRAF portions. A boundary area width area may include the entire width of the corresponding test SRAF. The width may also include any imperfection extending away from the test SRAF, such as bumps, streaks, etc. Some imperfections may cause otherwise unprintable SRAF's to become printable and may be included within the boundary area to be inspected. The boundary area width may conform to each longer side, even if it is uneven. Alternatively, the boundary area width may be a predefined amount larger than the SRAF's width (e.g., as shown in FIGS. 7 and 8). However, the boundary area width may be sufficiently narrow to facilitate flux measurement. The flux measurement generally includes determining amount of light transmitted through or blocked by features within boundary layer areas. For example, in the flux measuring method that accounts for transmitted light, wide boundary areas may diminish blocking effect by features within boundary areas. Therefore, the sensitivity of flux inspection of SRAF thickness may be impacted by boundary area width. In another example, where the flux measuring method accounts for blocked light, the impact of boundary widths on sensitivity of the method may be less.

Establishing test SRAF boundary areas (block 606) may ignore some length portions at the ends of the corresponding SRAF's. SRAF lengths and proximity of SRAF ends to other representations of IC features may be inspected during the reticle inspection (block 504 of FIG. 5) and may be ignored in the SRAF inspection operation. Moreover, SRAF length may generally have less impact than SRAF width due to the high aspect ratio of SRAF design. Light diffraction caused by the SRAF shorter edges may be minimal relative to diffraction caused by the longer edges. In one embodiment, the boundary area may have length no greater than about 90% of the corresponding SRAF length. Other length ratios may be used, such as between about 10% and 80% of the corresponding SRAF length. Overall, any length of the boundary layer that provides adequate representation of the SRAF width nay be acceptable. Additional considerations in establishing SRAF boundary areas are discussed in the context of FIG. 7.

The SRAF inspection then continues with obtaining flux measurements for the test SRAF boundary areas (block 608). Flux measurement typically involves partitioning the image of the inspected area into individual pixels. Pixel size may depend on resolution of the inspection system and required sensitivity of the inspection method. Each pixel is then assigned a numerical value corresponding to a matching grayscale shade of this pixel. For example, higher values may correspond to lighter pixels (i.e. more transmitted light) or to darker pixels (i.e. more blocked light). The values for each pixel are then summed up. In the embodiment where lighter pixels have higher numerical values, the summation represents the overall light flux transmitted through the inspected area. Larger values for boundary areas correspond to thinner SRAF's within these areas since less light is blocked by thinner SRAF's. Alternatively, in the embodiment where darker pixels have higher numerical values, larger summation values may indicate thicker SRAF'S within the corresponding boundary area. Overall, a summed flux value is representative of SRAF thickness in the area. Additional description of flux measurement is provided in the context of FIG. 8.

Another operation may include obtaining a flux measurement for a boundary area of one or more reference's SRAF (block 610), e.g., one or more reference flux measurements. The boundary area and its corresponding reference flux may be obtained in a variety of ways. In one embodiment, at least one reference circuit pattern having corresponding SRAF's (e.g., from one or more adjacent cells or dies) may be provided. An image and flux measurement for SRAF boundaries on the reference circuit pattern may be then obtained in the same way as for the test circuit pattern. However, some variations in establishing reference SRAF boundary areas and measuring flux may exist. For example, if the flux measurement corresponds to amount of light blocked by SRAF's (e.g., darker pixels have higher numerical values), then some variation in the width of test boundaries may be permitted. Usually, more that one reference patterns may be used. Multiple samples may compensate for measuring errors and size variations among reference samples. Reference flux measurements from multiple reference patterns may be averaged to obtain a reference flux value that is compared to the test flux measurement.

In one embodiment, at least two reference patterns may be used. At least two reference flux measurements may be obtained for at least two reference patterns so as to determine which of the test pattern and two references patterns is actually undersized or oversized (if any). That is, when two of these three patterns have a same flux, then it may be determined that the non-matching pattern is either undersized or oversized, depending on whether the difference is negative or positive.

In another embodiment, the reference flux value may be provided from the design database. For example, a circuit pattern database may contain information about the presence of SRAF's and design location on the reticle, such as in a separate GDSII layer. An input file may be loaded into the inspection system providing SRAF information. The file may be then translated into a format specific to the inspection system. For example, KLA-Tencor reticle inspection systems use 5xx database format for the files used to generate specific control layers. The file may include coordinates of the SRAF locations and SRAF dimensions. Moreover, the file may specify SRAF boundary areas that can be used as a reference boundary area. A data server may be used to supply SRAF information to the image computer processors. The provided design data for an SRAF can be rendered into an image for a reference SRAF and corresponding boundary area for such reference SRAF. A simulation algorithm may be then used to determine a corresponding flux values for these thicknesses through established boundary areas.

Another operation in the SRAF measurement may include comparing the test flux to the reference flux (or at least two reference flux measurements) (block 612). Light flux measurement may be expressed as a numerical value that corresponds to amount of transmitted or blocked light for a corresponding boundary area. Additional details of the flux measurement are described in U.S. Pat. No. 5,966,677, issued Oct. 12, 1999 and U.S. Pat. No. 6,539,331, issued Mar. 25, 2003, both patents by Peter J. Fiekowsky, which patents are incorporated herein by reference for all purposes. Such values may be then compared to one another, which corresponds to the next operation of determining whether the test SRAF is undersized or oversized (block 614). For example, in the embodiment where the flux measurement represents amount of transmitted light, if the test flux measurement is greater than the reference flux measurement, then the test SRAF is considered to be undersized. If the test flux measurement is less than the reference flux measurement than the test SRAF is considered to be undersized. On the other hand, in the embodiment where the flux measurement value represents blocked light, the oversized SRAF corresponds to the test flux measurement being greater than the reference flux measurement. If the test flux measurement is less than the reference flux measurement, then the SRAF is considered to be undersized.

Oversized SRAF's are then inspected using the first threshold to determine whether the oversized SRAF's are defective (block 616). Similarly, undersized SRAF's are inspected using the second threshold to determine whether the undersized SRAF's are defective (block 618). Thresholds may be numerical values corresponding to flux measurements of SRAF's with maximum allowable width (first threshold) and minimum allowable width (second threshold). Oversized SRAF's may present greater concerns in the photolithography process than undersized SRAF's. Therefore, the first threshold may be set more stringently than the second threshold. Note that a flux measurement (and the first and second threshold) is a numerical value representing either transmitted or blocked light for the entire boundary area encompassing SRAF. In both cases, the value corresponds to the thickness of the SRAF. In one embodiment, the first threshold value corresponds to about 110% to 150% of the design value of the SRAF thickness. In the same or another embodiment the second threshold value corresponds to about 0% to 80% of the design value for SRAF thickness. The test flux measurement determined is then compared to threshold values. If an oversized SRAF exceeds the first threshold, then this SRAF is considered to be defective. Similarly, if an undersized SRAF falls below the second threshold, then this SRAF is considered defective. Note that depending on the flux method (e.g., summing transmitted light v. blocked light) exceeding threshold may mean either being greater or less than the numerical value associated with this threshold.

FIG. 7 is a schematic representation of establishing boundaries of multiple SRAF's that encompasses width and length portions of the SRAF's. A typical element circuit 706 may have at least one SRAF along the edge of the element. Using more than one SRAF presents various alternatives for establishing test SRAF boundary areas (refer to block 606 in FIG. 6). For example, when two SRAF's 708 and 710 are used along the edge of the main feature 706, a boundary layer 712 may be established to incorporate both SRAF's as is shown in schematic 702. Alternative, two boundary layers 714 and 716 may be established to incorporate each of the two SRAF's as shown in the schematic 704. This concept may be similarly applied to sets of three and more SRAF's. Selecting an alternative may depend on the variety of factors, such as a flux measurement method used, design thickness of SRAF's and spacing between SRAF's, and likelihood of SRAF's being oversized and undersized. Combining several SRAF's into a single boundary may accelerate inspection. However, it may also present some difficulties in setting threshold values. For example, in a two SRAF configuration shown in 702, one SRAF may be significantly thicker than designed, while another SRAF may be significantly thinner than designed. The measured test flux from the boundary area 712 encompassing both SRAF portions may be close to nominal despite the variations in the SRAF's' thicknesses.

SRAF boundary areas do not need to include the ends of the SRAF. As it was already established above, SRAF's length is not as critical as SRAF's thickness. Moreover, an SRAF's length tends to vary significantly which would impact sensitivity of the flux measurement. For example, if a boundary is drawn around the entire length of the SRAF, then shorter SRAF will allow more light transmission which might be attributed either to SRAF's length or its thickness. In one embodiment, the boundary layer is established such that SRAF's ends are not included. In a specific embodiment, the boundary layer may be no longer than 90% of the design length of the tested SRAF. The length of the boundary may be also referred to as a length portion of the tested SRAF. In another embodiment, the boundary layer may be no longer than 80% of the design length of the tested SRAF.

The boundary areas of the test and reference SRAFs are selected so that the flux measurements of identical test and reference SRAF's will be substantially the same and the flux measurements of non-identical test and reference SRAF's will differ. This goal can be accomplished by forming the boundary area of each SRAF (e.g., reference and test SRAF) to conform to the edges of SRAF. For example, an undersized test SRAF will have a smaller boundary area than a corresponding reference SRAF, which difference will result in different flux values. In another embodiment, the boundary area of each SRAF conforms to each longer side, but not the shorter side. In this embodiment, the lengths the test and reference SRAF's are selected to be the same so that different lengths do not affect the flux measurement or determination for such test and reference SRAF's.

In another embodiment, each boundary area may be selected to have a width that is larger than its corresponding SRAF. For instance, each boundary area may have a width that is a predefined amount larger than its corresponding SRAF. In one of many examples, the boundary area of the test SRAF has a width that is 10% larger than the width of the SRAF. Each reference boundary area would also have a width that was 10% larger than its corresponding reference SRAF. Alternatively, the boundary areas of the test and reference SRAF's may have an identical width that is selected to be large enough to encompass the width the largest of the test and reference SRAF's. Setting the width of the boundary area may directly affect the flux method that accounts for transmitted light. The wider boundary area diminishes effect of the block light. Accordingly in certain embodiments, each boundary area may have a width that is no greater than 200% of the corresponding SRAF. In another embodiment, the boundary area may have width that is no greater than 150% of the corresponding SRAF.

FIG. 8 is a schematic representation of the flux measurement. The boundary area around the flux may be established based on location and preliminary determination of boundary thickness (schematic 802). Then the light is passed through the reticle, and the image corresponding to the boundary area is established. Because of the light diffraction, the resulting image will have blurred edges (schematic 812). The closer inspection of the image (schematic 812) reveals that the blurred edge has varying degrees of contrast, i.e. gray scale. The center area 820 that is the closest to the center line 914 of the image has the darkest shade. As the areas get further removed from the center line, the shade gets lighter. Thus, the middle area, which is the next area from the center 814 line, may be lighter than the center area 820. Likewise, the most remote area 816 from the center line 814 will be the lightest. The division into specific areas is presented here only as an example. The actual gray scale profile may represent the continuum.

Figure 9:
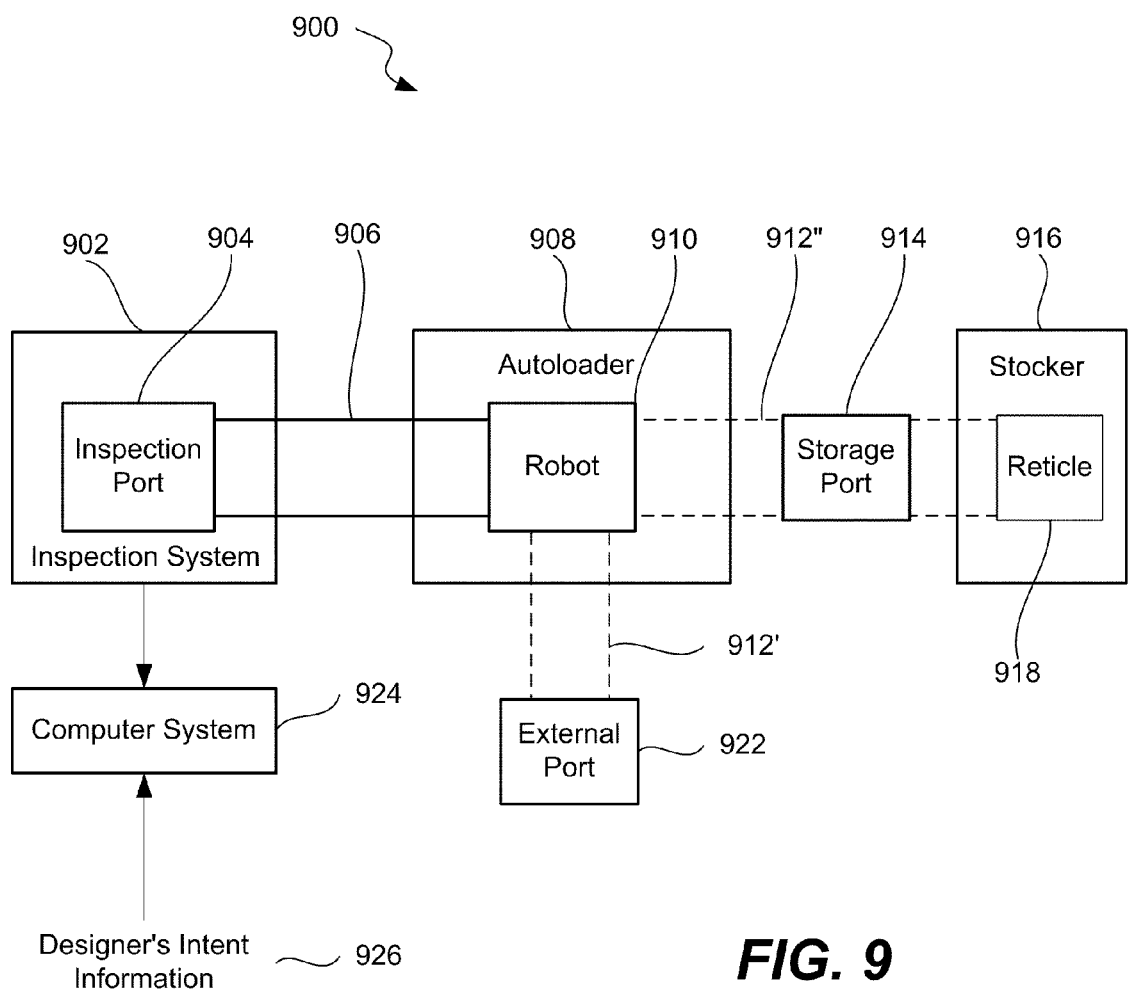
FIG. 9 shows an example reticle inspection station-reticle stocker station upon which techniques for inspecting the reticle may be implemented in a specific embodiment of the present invention.

FIG. 9 shows a reticle inspection station-reticle stocker station upon which processes of FIG. 5 and FIG. 6 of inspecting the reticle would be implemented in a specific embodiment of the present invention. The invention may be used with any suitable inspection or fabrication system. An autoloader 908 for automatically transporting reticles includes a robot 910 having an arm 906 extending towards a inspection port 904 of a reticle inspection station 250. Arm 912 may rotate and can extend towards an external port 922 when in its state denoted by reference number 912'. Similarly, when in its state denoted by reference number 912", the robotic arm can also extend towards a storage port 914 of a reticle stocker station 916 that typically includes several slots or tracks for storing reticles. The robotic arm is designed to further extend and retrieve a reticle 918 from reticle stocker station 916.

A typical inspection process, according to one embodiment of the present invention, may begin after reticle 918 is placed on external port 922, with the intention of storing the reticle in reticle stocker station 916 until it is used in a subsequent inspection application, for example. Robotic arm in its position 912' transports the reticle from external port 922 and stores it in a loading port of reticle stocker station 916 by extending as shown in FIG. 9. When the reticle is needed for production, for example, robotic arm 912" retrieves reticle 918 from the loading port and places it on inspection port 904 of inspection system 902.

The inspection system 902 is coupled with a computer system 924 where inspection process detailed above is carried out and it is determined whether the reticle has passed inspection. The computer system 924 may be integral to inspection system 902 or separate from the inspection system 902. The inspection system 902 may also receive data 926 regarding specific features in the form of data structures, for example, having shadow layers or flags for identifying SRAF's. Additionally, the computer system 924 receives image data from the inspection system 902. The image data is analyzed, and may be based, at least in part, on additional feature data 926. After the reticle inspection has concluded, reticle 918 is placed on external port 922 so that it may be carried to a fabrication facility for use, assuming of course, that it has passed inspection. Alternatively, the reticle 918 may be repaired or remade.

Suitable computer systems for use in implementing and controlling the methods in the present invention (e.g., controlling the settings of the various scanning apparatus components, retrieving database records specifying regions of normal and enhanced analysis, storing different threshold values, storing baseline image of the reticle, storing a new image of the reticle, comparing the new image with the baseline image, storing the location of defects, etc.) may be obtained from various vendors. In one preferred embodiment, an appropriately programmed Silicon Graphics 0-200 computer (Mountain View, Calif.) or Sun SPARC (Sun Microsystems, Sunnyvale, Calif.) may be employed. In any case, the computer system preferably has one or more processors coupled to input/output ports, and one or more memories via appropriate buses or other communication mechanisms.

The term "electronic representation" as used herein covers any machine readable representation. Typically, such representations are stored on magnetic, electronic, or optically readable media. The content of such representations may be transmitted as electrical signals, magnetic signals, electromagnetic signals, optical signals, etc.

Preferably, an optical, electron beam, or other inspection system is integrated with a computer system which implements many of the method steps of this invention. Such composite system preferably includes at least (a) a baseline image (preferably compacted) stored in a memory, (b) an imaging system arranged to generate an optical or electron beam image of the reticle, and (c) a processing unit configured to compare the baseline and current test images and thereby identify defects. At a minimum, the imaging system will usually include (i) a source of illumination oriented to direct radiation onto a specified location of the reticle; and (ii) one or more detectors oriented to detect an image of the reticle from the source which has been scattered by the reticle. The imaging system may also include a scanning means.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein. All references cited herein are incorporated by reference for all purposes.

What is claimed is:

1. A method of inspecting a sub-resolution assist features (SRAF) on a reticle, comprising:
   (a) providing a test SRAF on a reticle;
   (b) determining a test flux measurement for a test boundary area that encompasses a width of the test SRAF and a length portion of the test SRAF and determining at least one reference flux measurement for one or more reference boundary areas of one or more reference SRAF's, wherein each reference boundary area encompasses a width of each reference SRAF and a length portion of such each reference SRAF;
   (c) comparing the test flux measurement with the one or more reference flux measurement to determine whether the test SRAF is undersized or oversized; and
   (d) if the test SRAF is determined to be oversized, determining whether the test SRAF is defective based on the comparison using a first threshold.

2. The method of claim 1, further comprising:
   if the test SRAF is determined to be undersized, determining whether the test SRAF is defective based on the comparison using a second threshold that differs from the first threshold.

3. The method of claim 1, further comprising:
inspecting the reticle using a decreased sensitivity for the test SRAF, as compared to a sensitivity that is used for other features of the reticle that do not include SRAF's.

4. The method of claim 1, further comprising:
inspecting the reticle so as to exclude inspection of the test SRAF from the reticle inspection process.

5. The method of claim 2, wherein an absolute value of the first threshold and a design value is less than an absolute value of the second threshold.

6. The method of claim 1, wherein the reference flux measurement is determined based on a design database.

7. The method of claim 1, wherein one or more reference SRAF's are located on the reticle.

8. The method of claim 1, wherein at least two reference flux measurements are determined.

9. The method of claim 1, wherein the boundary area and one or more reference boundaries are established based on a plurality of parameters from a design database.

10. The method of claim 1, wherein the length portion of the test SRAF does not include ends of the test SRAF and the length portion of such each reference SRAF does not include the ends of such each reference SRAF.

11. The method of claim 1, wherein the length portion of the test SRAF is no greater than about 90% of a design length of the test SRAF.

12. The method of claim 1, further comprising a second SRAF, wherein determining the test flux measurement for the boundary area also encompasses a width of the second SRAF and a length portion of the second SRAF.

13. The method of claim 1, wherein the boundary area has a width of no greater than about 200% of a test SRAF width and each reference boundary areas has a width of no greater than about 200% of such each reference SRAF width.

14. The method of claim 3, wherein determining a test flux measurement is performed separately from inspecting the reticle using the decreased sensitivity.

15. A computer readable medium containing program instructions for inspecting a sub-resolution assist features (SRAF) on a reticle, the computer readable medium comprising:
(a) computer readable code for providing a test SRAF on a reticle;
(b) computer readable code for determining a test flux measurement for a test boundary area that encompasses a width of the test SRAF and a length portion of the test SRAF and determining at least one reference flux measurement for one or more reference boundary areas of one or more reference SRAF's, wherein each reference boundary area encompasses a width of each reference SRAF and a length portion of such each reference SRAF;
(c) computer readable code for comparing the test flux measurement with the one or more reference flux measurement to determine whether the test SRAF is undersized or oversized; and
(d) computer readable code for determining, if the test SRAF is determined to be oversized, whether the oversized test SRAF is defective based on the comparison using a first threshold.

16. A system for inspecting a sub-resolution assist features (SRAF) on a reticle, comprising at least one memory and at least one processor that are configured to perform the following operations:
(a) providing a test SRAF on a reticle;
(b) determining a test flux measurement for a test boundary area that encompasses a width of the test SRAF and a length portion of the test SRAF and determining at least one reference flux measurement for one or more reference boundary areas of one or more reference SRAF's, wherein each reference boundary area encompasses a width of each reference SRAF and a length portion of such each reference SRAF;
(c) comparing the test flux measurement with the one or more reference flux measurement to determine whether the test SRAF is undersized or oversized; and
(d) if the test SRAF is determined to be oversized, determining whether the test SRAF is defective based on the comparison using a first threshold.

17. The system of claim 16, wherein the at least one memory and at least one processor are further configured to, if the test SRAF is determined to be undersized, determining whether the test SRAF is defective based on the comparison using a second threshold that differs from the first threshold.

18. The system of claim 17, wherein the at least one memory and at least one processor are further configured to inspecting the reticle using a decreased sensitivity for the test SRAF, as compared to a sensitivity that is used for other features of the reticle that do not include SRAF's.

19. The system of claim 17, wherein the at least one memory and at least one processor are further configured to inspecting the reticle so as to exclude inspection of the test SRAF from the reticle inspection process.

20. The system of claim 17, wherein an absolute value of the first threshold and a design value is less than an absolute value of the second threshold.

* * * * *